US009964856B2

(12) United States Patent
Maul (10) Patent No.: US 9,964,856 B2
(45) Date of Patent: May 8, 2018

(54) ILLUMINATION OPTICAL UNIT FOR PROJECTION LITHOGRAPHY (71) Applicant: Carl Zeiss SMT GmbH, Oberkochen (DE)

(72) Inventor: Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 652 days.

(21) Appl. No.: 14/528,275

(22) Filed: Oct. 30, 2014

(65) Prior Publication Data

US 2015/0055110 A1 Feb. 26, 2015

Related U.S. Application Data (63) Continuation of application No. PCT/EP2013/059383, filed on May 6, 2013.
(Continued)

(30) Foreign Application Priority Data

May 31, 2012 (DE) .................. 10 2012 209 132

(51) Int. Cl.
G03B 27/72 (2006.01)
G03F 7/20 (2006.01)
(Continued)

(52) U.S. Cl.
CPC ......... *G03F 7/7015* (2013.01); *G02B 17/002* (2013.01); *G02B 26/0816* (2013.01);
(Continued)

(58) Field of Classification Search
CPC .............. G02B 17/002; G02B 26/0816; G02B 26/0833; G02B 26/0841; G02B 26/085;
(Continued)

(56) References Cited

U.S. PATENT DOCUMENTS 6,195,201 B1 2/2001 Koch et al.
7,471,456 B2 12/2008 Komatsuda
(Continued)

FOREIGN PATENT DOCUMENTS

DE 102007041004 A1 3/2009
EP 2 487 543 A2 8/2012
(Continued)

OTHER PUBLICATIONS

German Office Action, with translation thereof, for corresponding DE Appl No. 10 2012 209 132.7, dated Jan. 8, 2013.
International Search Report for corresponding PCT Appl No. PCT/EP2013/059383, dated Sep. 18, 2013.
Japanese office action, with English translation thereof, for JP Appl No. 2015-514399, dated Mar. 10, 2017.

*Primary Examiner* — Christina Riddle
(74) *Attorney, Agent, or Firm* — Fish & Richardson P.C.

(57) ABSTRACT

An illumination optical unit for projection lithography illuminates an object field with illumination light. The illumination optical unit has a collector for collecting the emission of a light source for the illumination light. The collector is arranged such that it transfers the illumination light from the light source into an intermediate focus. The illumination optical unit furthermore has a field facet mirror and a pupil facet mirror, each having a plurality of facets. The field facets are imaged into the object field by a transfer optical unit. The illumination optical unit additionally has an individual-mirror array having individual mirrors tiltable in a manner driven individually. The array is arranged upstream of the field facet mirror and downstream of the intermediate focus in an illumination beam path.

20 Claims, 7 Drawing Sheets

Related U.S. Application Data (60) Provisional application No. 61/653,490, filed on May 31, 2012.

(51) Int. Cl.
*G02B 17/00* (2006.01)
*G02B 26/08* (2006.01)

(52) U.S. Cl.
CPC .......... *G03F 7/702* (2013.01); *G03F 7/70075* (2013.01); *G03F 7/70091* (2013.01); *G03F 7/70116* (2013.01); *G03F 7/70191* (2013.01); *G03F 7/70566* (2013.01)

(58) Field of Classification Search
CPC ............. G02B 26/0858; G03F 7/70075; G03F 7/70083; G03F 7/70091; G03F 7/70108; G03F 7/70116; G03F 7/70125; G03F 7/7015; G03F 7/70191; G03F 7/702; G03F 7/70566
USPC .... 355/52, 53, 55, 67–71, 77; 359/850, 851, 359/854–857, 861, 862, 865, 872–877; 250/492.1, 492.2, 492.22, 492.23, 493.1, 250/503.1, 504 R, 505.1
See application file for complete search history.

(56) References Cited

U.S. PATENT DOCUMENTS

| | | | |
|---|---|---|---|
| 2007/0132977 A1* | 6/2007 | Komatsuda | G02B 17/002 355/60 |
| 2011/0001947 A1 | 1/2011 | Dinger et al. | |
| 2012/0188526 A1* | 7/2012 | Oshino | G03F 7/70116 355/67 |
| 2012/0206704 A1 | 8/2012 | Wangler et al. | |
| 2014/0211187 A1 | 7/2014 | Hauf et al. | |
| 2014/0362360 A1* | 12/2014 | Saenger | G03F 7/70075 355/67 |
| 2016/0195820 A1 | 7/2016 | Fiolka et al. | |

FOREIGN PATENT DOCUMENTS

| | | | |
|---|---|---|---|
| JP | 2006-128321 | 5/2006 | |
| JP | 2011-525637 | 9/2011 | |
| WO | WO 2006/082738 | 8/2006 | |
| WO | WO 2009/095052 A1 | 8/2009 | |
| WO | WO 2009/100856 A1 | 8/2009 | |
| WO | WO 2010/049076 A2 | 5/2010 | |
| WO | WO 2011040488 A1 * | 4/2011 | ......... G02B 17/0663 |

* cited by examiner

ILLUMINATION OPTICAL UNIT FOR PROJECTION LITHOGRAPHY

CROSS-REFERENCE TO RELATED APPLICATIONS

The present application is a continuation of, and claims benefit under 35 USC 120 to, international application PCT/EP2013/059383, filed May 6, 2013, which claims benefit under 35 USC 119 of German Application No. 10 2012 209 132.7, filed May 31, 2012. International application PCT/EP2013/059383 also claims priority under 35 USC 119(e) to U.S. Provisional Application No. 61/653,490, filed May 31, 2012. The entire disclosure of international application PCT/EP2013/059383 and German Application No. 10 2012 209 132.7 are incorporated by reference herein.

The invention relates to an illumination optical unit for projection lithography for illuminating an object field, in which an object to be imaged can be arranged, with illumination light. Furthermore, the invention relates to an illumination system comprising an illumination optical unit of this type, a projection exposure apparatus comprising an illumination system of this type, a production method for producing a micro- or nanostructured component using such a projection exposure apparatus, and a micro- or nanostructured component produced by such a production method.

An illumination optical unit of the type mentioned in the introduction is known from DE 10 2007 041 004 A1, WO 2010/049076 A2 and WO 2009/095052 A1. US 2011/0 001 947 A1 and U.S. Pat. No. 6,195,201 B1 each describe illumination optical units for projection lithography for illuminating an object field comprising a field facet mirror and a pupil facet mirror. An illumination optical unit comprising an individual-mirror array is known from WO 2009/100 856 A1.

A problem addressed by the present invention is that of making the illumination of the object to be imaged flexible and readily adaptable to predetermined values.

This problem is solved according to the invention via an illumination optical unit for projection lithography for illuminating an object field, in which an object to be imaged can be arranged, with illumination light,
  comprising a collector for collecting the emission of a light source for the illumination light,
  wherein the collector is arranged such that it transfers the illumination light from the light source into an intermediate focus,
  comprising a field facet mirror having a plurality of field facets,
  comprising a pupil facet mirror having a plurality of pupil facets,
  wherein the field facets are imaged into the object field by a transfer optical unit;
  comprising an individual-mirror array having individual mirrors tiltable in a manner driven individually, the array being arranged upstream of the field facet mirror in an illumination beam path,
  wherein the individual-mirror array is arranged downstream of the intermediate focus in the illumination beam path,
  with a configuration in such a way that the intermediate focus is imaged via illumination channels, which are each formed by at least one of the individual mirrors and at least one of the field facets and which guide a partial beam of the illumination light, into a spatial region in which the pupil facet mirror is situated.

It has been recognized according to the invention that an individual-mirror array arranged upstream of the field facet mirror yields new degrees of freedom in the design of the object field illumination. By way of example, it is possible to achieve specific target reflection angles at the field facets and/or at the pupil facets. This can be used for the targeted utilization of polarization effects during reflection at the facets. The individual-mirror array can be embodied as a multi- or micromirror array and can be embodied, in particular, as a microelectromechanical system (MEMS). The facets of the field facet mirror and/or the facets of the pupil facet mirror can be embodied as rigid facets, that is to say facets that cannot be tilted between different tilting positions. The field facets of the field facet mirror can be arranged in non-continuous facet regions, between which interspaces are present. The individual facet regions separated from one another can be arranged with a greater number of degrees of freedom with respect to one another. A non-continuous arrangement of facet regions can be used particularly when a beam path of the illumination light upstream of the field facet mirror is already split into different partial beams. The field facets of the field facet mirror can be arranged in their entirety such that they are reached by the individual mirrors of the individual-mirror array with tilting positions of the individual mirrors with small absolute tilting angles. Field facets which image the intermediate focus onto different pupil facets can be arranged such that a tilting angle necessary for the individual mirrors for attaining such a respective illumination geometry, in order that the illumination light reaches the desired field facets, is attained as rapidly as possible in each case. The pupil facets of the pupil facet mirror can also be arranged in a hexagonally densest packing, can be arranged in a Cartesian arrangement, that is to say in rows and columns, or can also be arranged rotationally symmetrically. The arrangement of the pupil facets can be deformed, for example in order to correct distortion effects. The pupil facet mirror can be an imaging constituent part of the transfer optical unit and have, for example, concave and/or convex pupil facets. Alternatively, the pupil facets can also be configured as pure deflection mirrors. The transfer optical unit can then be arranged downstream of the pupil facet mirror. The field facet mirror can have a few thousand field facets. The pupil facet mirror can have a few thousand pupil facets. The number of field facets can be equal to the number of pupil facets. The individual mirrors of the individual-mirror array can have plane reflection surfaces. The number of individual mirrors can be at least equal to the number of field facets. The number of individual mirrors of the individual-mirror array can be much greater than the number of field facets and can be for example ten times as great or even greater. The illumination optical unit can be configured such that the individual-mirror array is not imaged onto the pupil facets. The illumination optical unit can be configured such that the individual-mirror array is not imaged onto the field facets. Correction individual mirrors of the individual-mirror array can be used via swinging away for the correction of an intensity distribution and/or for the correction of an illumination angle distribution over the object field or over an image field into which the object field is imaged. Reflection surfaces of the pupil facets can be configured as correction aspheres in order to correct imaging aberrations of an imaging of the field facets into the object field. A polarization control of the illumination light can be realized with the illumination optical unit. An illumination and imaging geometry for projection lithography can be brought about in which object structures are imaged with, in particular, linearly polarized illumination light such that diffraction planes predetermined by diffraction angles of the illumination light diffracted at the object structure form an angle with a direction of polarization of the illumination light, which angle deviates from a normal to the respective diffraction plane by not more than 20°, by not more than 15°, by not more than 10° or even by not more than 5°. This can be used for optimizing the imaging.

The field facets of the field facet mirror can deviate from a form of the object field in order to at least partly compensate for imaging effects during the imaging of the field facets into the object field. For this purpose, the field facet mirror can have a plurality of field facet form types, wherein the individual field facet form types differ from one another.

An embodiment in which a light path in the illumination beam path between the intermediate focus and the individual-mirror array is longer than a light path in the illumination beam path between the individual-mirror array and the field facet mirror has proved to be particularly suitable for optimizing in particular an etendue of the illumination optical unit.

A fixed assignment in which the field facets and the pupil facets have an arrangement in such a way that illumination channels, each formed by exactly one of the field facets and exactly one of the pupil facets, wherein the facets are aligned for guiding a partial beam of the illumination light, are in each case fixedly assigned to a facet pair to which the field facet and the pupil facet belong makes possible a monolithic design of the field facet mirror and/or of the pupil facet mirror without tiltable facets. Via the tiltability of the individual mirrors of the individual-mirror array, it is then possible to select which of the illumination channels are impinged upon by illumination light. In this case, the illumination channels need not be completely filled with illumination light, rather it may suffice, for example, to illuminate only part of a field facet of an illumination channel.

A point-symmetrical arrangement in which field facets of a field facet pair are assigned to a pupil facet pair whose pupil facets are arranged point-symmetrically with respect to a center of the pupil facet mirror leads to the possibility of pairing of illumination channels having mutually corresponding reflection angles or mutually corresponding influences on the illumination channels of the facet pairs. This can be used for symmetrizing the illumination.

In the case of illumination in sections with an arrangement of the illumination system in such a way that at least some of the field facets are illuminated with the illumination light in field facet sections via the individual mirrors, images of the illuminated field facet sections can overlap in the object field. However, this is not mandatory. An illuminated field facet section can have for example an area extent corresponding to a fraction of the entire reflection surface, for example one half, one third, one quarter, one fifth or one tenth. In particular, illumination of the field facets in sections in a stripwise manner via the individual mirrors is possible. In the case of a light source having a predetermined etendue, the illumination in sections makes it possible to increase the number of derivable illumination channels, which are then in each case only partly impinged upon by illumination light reflected from the illuminated field facet section. The possibility of more homogeneous pupil filling during illumination, in particular during scan-integrated imaging, is the consequence.

Angles of incidence of the illumination beam path along illumination channels, each formed by a field facet and a pupil facet, which are aligned for guiding a partial beam of the illumination light, which angles deviate by a maximum of 25° from a Brewster angle of a multilayer reflection coating on the field facet and the pupil facet, make possible the targeted setting of linearly polarized illumination rows. In particular, a tangential illumination of the object field can thereby be achieved in which a direction of polarization of an illumination ray is in each case perpendicular to a plane of incidence of the illumination ray on the object to be illuminated. In particular, all illumination channels can fulfill this angle-of-incidence condition.

An arrangement of the field facet mirror on a field facet mirror carrier, having at least one passage opening for the illumination light which is guided in a section of the illumination beam path between the pupil facet mirror and the object field, is one example of the possibility for variants of the field facet mirror arrangement. Geometries arise which make it possible to fulfill specific reflection-angle conditions.

The same correspondingly applies to illumination light guides in which the illumination light is guided through the at least one passage opening between the intermediate focus and the individual-mirror array, and in which the illumination light is guided through the at least one passage opening between a component of the transfer optical unit, the component being disposed downstream of the pupil facet mirror, and the object field.

The field facets of the field facet mirror can be arranged on a facet mirror carrier embodied rotationally symmetrically with respect to an axis of symmetry.

The field facets and/or the pupil facets can also each be constructed from a plurality of individual mirrors.

The facet mirror carrier or the individual-mirror carrier can be embodied in a ring-shaped fashion.

A projection optical unit for imaging the object field into an image field, in which a wafer to be exposed can be arranged, of an illumination system can be embodied in particular such that it effects eight-fold reduction. This limits an angle of incidence of the illumination light on an object configured, in particular, in a reflective fashion. The transfer optical unit of the illumination system, in particular a relay optical unit of the transfer optical unit, can be designed such that an entrance pupil of the projection optical unit is arranged in the illumination beam path upstream of the object field and in particular upstream of an element—which images the field facets—of a transfer optical unit (relay optical unit) for imaging the field facets into the object field. The pupil facet mirror can then be arranged in the region of the entrance pupil.

The advantages of a projection exposure apparatus comprising such an illumination system and comprising an EUV light source and of a projection exposure apparatus
  comprising an object holder for mounting the object to be imaged in the object field,
  comprising an object displacement drive for the controlled displacement of the object holder along an object displacement direction,
  comprising a wafer holder for mounting the wafer in the image field,
  comprising a wafer displacement drive for the controlled displacement of the wafer holder along the object displacement direction,
correspond to those which have already been explained above in connection with the illumination optical unit and the illumination system. The illumination optical unit of the projection exposure apparatus can be coordinated with the light source such that illumination light which, if appropriate, has already been partially prepolarized by the light source is guided in the illumination optical unit such that linearly polarized illumination rays generated in particular via the illumination optical unit include the greatest possible portions of this prepolarization. This optimizes a used light efficiency of the projection exposure apparatus.

An illumination optical unit which is embodied in such a way that facet section images of the illuminated field facet sections represent strips in the object field which extend transversely with respect to the object displacement direction over an entire object field height of the object field produces a projection exposure apparatus with a variant-rich possibility for selection of illumination settings. Homogeneous fillings of selected pupil regions can be achieved. The facet section images can overlap in the object field. However, this is not mandatory. The facet section images can adjoin one another in the object field.

The advantages of a method for producing structured components comprising the following steps:
  providing a wafer, to which a layer composed of a light-sensitive material is at least partly applied,
  providing a reticle having structures to be imaged,
  providing a projection exposure apparatus according to the invention,
  projecting at least one part of the reticle onto a region of the layer of the wafer with the aid of the projection exposure apparatus,
and of a component produced according to this method correspond to those which have already been explained above with reference to the projection exposure apparatus.

Exemplary embodiments of the invention are explained in greater detail below with reference to the drawing, in which.

Figure 1:
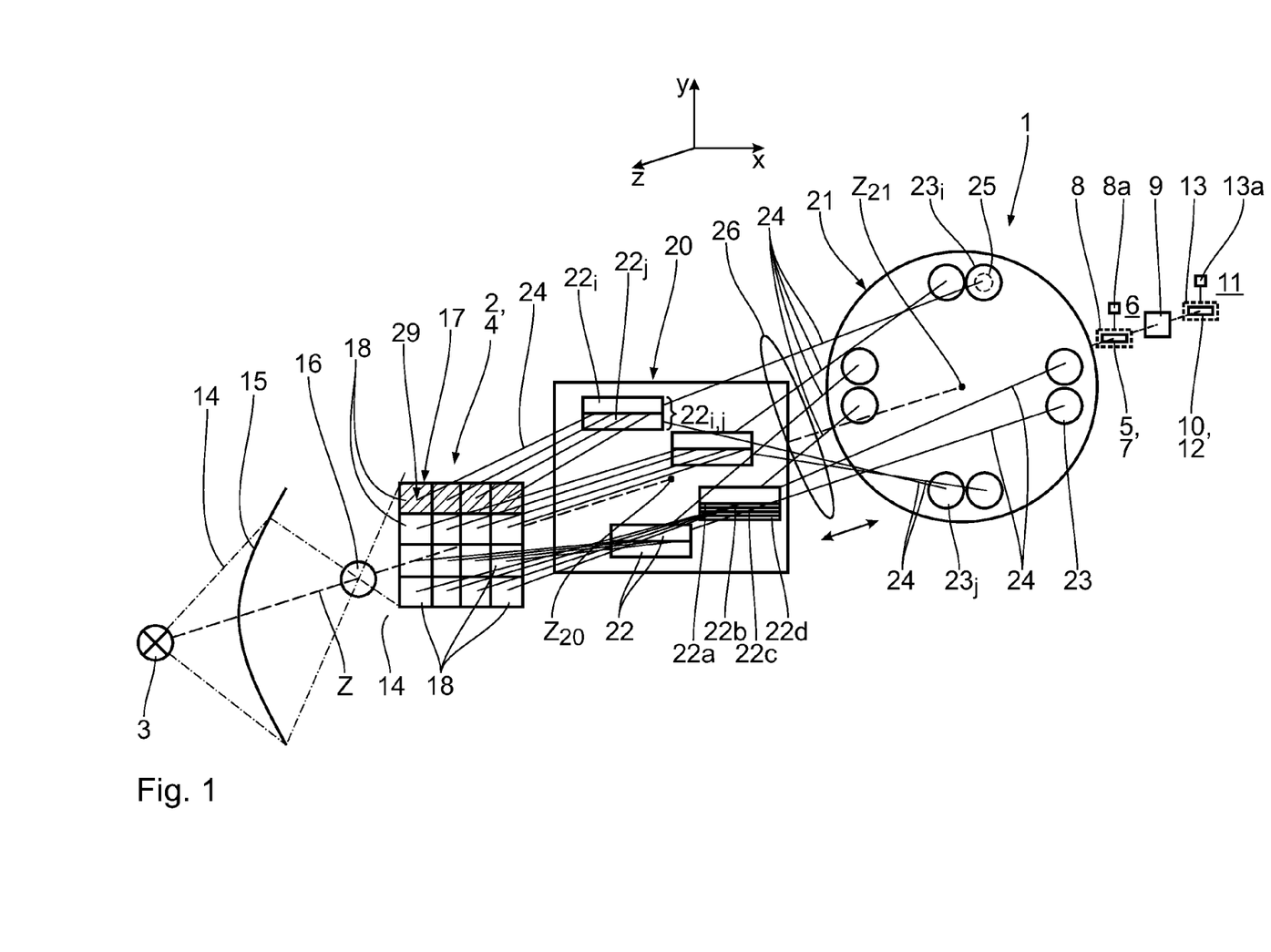
FIG. 1 shows highly schematically a projection exposure apparatus for projection lithography with functional planes which are arranged perspectively one behind another and each of which show functional components of the apparatus.

FIG. 1 shows highly schematically a projection exposure apparatus 1 for microlithography. The illustration shows, in a perspective view, a plurality of functional planes of the projection exposure apparatus 1 which are arranged one behind another, with functional components arranged there. It goes without saying that the actual beam path through the projection exposure apparatus 1, on account of the reflective effect of the functional components, proceeds differently from in the apparently transmissive representation according to FIG. 1.

An illumination system 2 of the projection exposure apparatus 1 has, besides a radiation or light source 3, an illumination optical unit 4 for exposing an object field 5 in an object plane 6.

In order to simplify an explanation of positional relationships, in the drawing a Cartesian xyz coordinate system is used hereinafter. An x-axis runs toward the right in FIG. 1. A y-axis runs upward in FIG. 1. A z-axis runs perpendicularly to the xy plane and in FIG. 1 perspectively along a central axis Z, which interconnects centers of the functional components of the projection exposure apparatus and which may coincide in sections with an optical axis of optical components of the projection exposure apparatus 1. The z-axis runs perpendicularly to the object plane 6.

A local Cartesian xyz coordinate system is depicted in selected figures from among the figures below, wherein the x-axis runs parallel to the x-axis according to FIG. 1 and the y-axis spans with the x-axis the optical area of the respective optical element. The y-axis of the local xyz coordinate system can be tilted with respect to the y-axis of the global Cartesian xyz coordinate system according to FIG. 1.

The object field 5 can be designed in rectangular or arcuate fashion with an x/y aspect ratio of 13/1, for example. A reflective reticle 7 arranged in the object field 5 is exposed via the illumination optical unit 4, the reticle bearing a structure that is to be projected via-the projection exposure apparatus 1 for producing micro- or nanostructured semiconductor components. The reticle 7 is carried by an object or reticle holder 8, which is indicated in a dashed manner in FIG. 1 and is displaceable in the y-direction in a manner driven via an object displacement drive 8a. A projection optical unit 9, illustrated extremely schematically in FIG. 1, serves for imaging the object field 5 into an image field 10 in an image plane 11. The illumination optical unit 4 and the projection optical unit 9 form an illumination system as the totality of the optical components of the projection exposure apparatus 1. The structure on the reticle 7 is imaged onto a light-sensitive layer of a wafer 12 arranged in the region of the image field 10 in the image plane 11. The wafer 12 is carried by a wafer holder 13, which is likewise indicated in a dashed manner and which is displaced in the y-direction in a manner driven with the aid of a wafer displacement drive 13a synchronously with the reticle holder 8 during projection exposure. In practice, the reticle 7 and the wafer 12 are actually significantly larger than the object field 5 and the image field 10.

During the operation of the projection exposure apparatus 1, the reticle 7 and the wafer 12 are scanned synchronously in the y-direction. Depending on the imaging scale of the projection optical unit 9, it is also possible for the reticle 7 to be scanned in an opposite direction relative to the wafer 12.

The radiation source 3 is an EUV radiation source having an emitted used radiation in the range of between 5 nm and 30 nm. This can be a plasma source, for example a GDPP source (Gas Discharge Produced Plasma), or an LPP source (Laser Produced Plasma). Other EUV radiation sources, for example those based on a synchrotron or on a free electron laser (FEL), are also possible.

An EUV radiation beam 14, which emerges from the radiation source 3 and is indicated by a dashed-dotted chief ray in FIG. 1, is focused by a collector 15. A corresponding collector is known from EP 1 225 481 A, for example. The EUV radiation beam 14 is also designated as used radiation, illumination light or as imaging light hereinafter.

Figure 2:
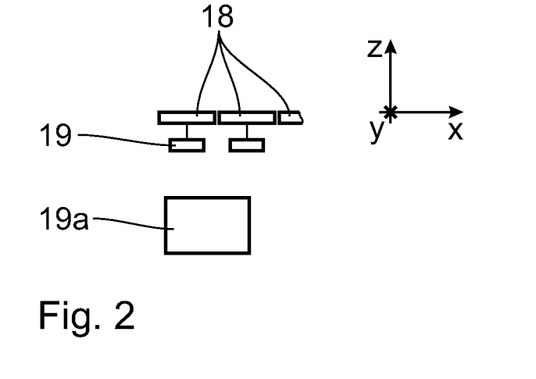
FIG. 2 shows likewise schematically, in a side view, an excerpt from an individual-mirror array of an illumination optical unit of the projection exposure apparatus according to FIG. 1.

Downstream of the collector 15, the EUV radiation beam 14 propagates through an intermediate focus 16 before impinging on an individual-mirror array 17. The individual-mirror array 17 is embodied as a microelectromechanical system (MEMS). It has a multiplicity of individual mirrors 18 arranged in matrix-like fashion in rows and columns in an array, which are illustrated schematically in FIG. 1. The individual mirrors 18 can have square or rectangular reflection surfaces. The individual mirrors 18 are in each case connected to actuators 19 (cf. FIG. 2) and designed to be tiltable about two axes perpendicular to one another in the reflection plane of the respective individual mirror 18. The actuators 19 are signal-connected, in a manner that is not illustrated, to a central control device 19a, via which the actuators 19 can be driven for the individual tilting of the individual mirrors 18.

The number of individual mirrors 18 of the individual-mirror array 17 is illustrated in a very greatly understated manner in the drawing. Overall, the individual-mirror array 17 has approximately 100 000 of the individual mirrors 18. Depending on the size of the individual mirrors 18, the individual-mirror array can also have for example 1000, 5000, 7000 or even hundreds of thousands of, for example 500 000, individual mirrors 18. The number of individual mirrors 18 can alternatively also be significantly lower and be for example a few hundred individual mirrors, for example 200, 250, 300 or 500 individual mirrors. If very many of the individual mirrors 18 are present, they can be combined in groups, wherein identical individual-mirror tilting angles are in each case present within one of the individual-mirror groups. The individual mirrors 18 can have a highly reflective multilayer optimized for the respective angle of incidence and the wavelength of the EUV used light 14.

A spectral filter can be arranged upstream of the individual-mirror array 17, the spectral filter separating the used EUV radiation beam 14 from other wavelength components of the emission of the radiation source 3 that are not usable for the projection exposure. The spectral filter is not illustrated.

Downstream of the individual-mirror array 17, the EUV radiation beam 14 impinges on a field facet mirror 20. The field facet mirror 20 is arranged in a plane of the illumination optical unit 4 that is optically conjugate with respect to the object plane 6.

Downstream of the field facet mirror 20, the EUV radiation beam 14 is reflected from a pupil facet mirror 21. The pupil facet mirror 21 lies either in an entrance pupil plane of the illumination optical unit 4 or in a plane that is optically conjugate with respect thereto. The field facet mirror 20 and the pupil facet mirror 21 are in each case constructed from a multiplicity of facets, which are also designated as fly's eye cells and are described in even greater detail below. Field facets 22 of the field facet mirror 20 are imaged into the object field 5 by a transfer optical unit, which either is formed by the pupil facet mirror 21 or to which further components between the pupil facet mirror 21 and the object field 5 belong. In this case, each of the field facets 22, if it is completely illuminated with the illumination light 14, is imaged into the entire object field 5. The field facets 22 are arranged on a facet mirror carrier, which is indicated schematically in FIG. 1 and otherwise not illustrated in more specific detail.

The EUV radiation beam 14 impinges on the individual-mirror array 17 at an angle of incidence that is less than 70°, that is to say not with grazing incidence. Grazing incidence is also possible, in principle. The field facets 22 of the field facet mirror 20 and pupil facets 23 of the pupil facet mirror 21 bear multilayer reflection coatings that are coordinated with the wavelength of the used light 14. The pupil facets 23 can be embodied in round, hexagonal or rectangular fashion.

Only some of the field facets 22 and some of the pupil facets 23 of the facet mirrors 20, 21 are illustrated schematically and exaggeratedly in an enlarged manner in FIG. 1. The field facet mirror 20 has thousands of field facets 22, for example 3000 field facets 22. The pupil facet mirror 21 has thousands of pupil facets 23, for example 3000 pupil facets 23. The number of field facets 22 of the field facet mirror 20 can be equal to the number of pupil facets 23 of the pupil facet mirror 21.

The two facet mirrors 20, 21 are impinged on with an angle of incidence which deviates by at most 25° from a Brewster angle of the multilayer reflection coating on the field facets 22 and the pupil facets 23. This Brewster angle of incidence can be 43°, for example.

The pupil facet mirror 21 is arranged in a plane of the illumination optical unit 4 that constitutes a pupil plane of the projection optical unit 9 or is optically conjugate with respect to a pupil plane of the projection optical unit 9. With the aid of the pupil facet mirror 21 and/or the transfer optical unit, the field facets 22 of the field facet mirror 20 are imaged into the object field 5 in a manner being superimposed on one another.

The field facets 22 of the field facet mirror 20 have an x/y aspect ratio corresponding to the x/y aspect ratio of the object field 5. The field facets 22 therefore have an x/y aspect ratio that is greater than 1. A long facet side of the field facets 22 runs in the x-direction. A short facet side of the field facets 22 runs in the y-direction (scanning direction).

The arrangement of the illumination optical unit 4 is such that the intermediate focus 16 is imaged via illumination channels 24, which are formed by in each case at least one of the individual mirrors 18 and at least one of the field facets 22 and which guide a partial beam of the illumination light 14, into a spatial region in which the pupil facets 23 are situated. An intermediate-focus image 25 thus arises on each of the pupil facets 23. Depending on how many of the individual mirrors 18 contribute to the respective illumination channel 24, the intermediate-focus image 25 can arise as a superimposition of a plurality of intermediate-focus images which arise on account of the illumination light 14 being guided via a respective one of the individual mirrors 18 on the respective pupil facet 23. In this case, the intermediate-focus image 25 need not arise exactly on the pupil facet 23 of the respective illumination channel 24. It suffices if the respective pupil facet 23 is situated in the region of the intermediate-focus image 25, such that the intermediate-focus image 25 becomes situated, in particular, completely on the pupil facet 23.

Depending on whether the pupil facets 23 are constituent parts of the transfer optical unit which images the field facets 22 into the object field 5, the pupil facets 23 either have an imaging effect, that is to say are designed in particular in concave fashion, or are embodied as pure deflection or plane mirrors. The pupil facets 23 can bear correction aspheres for the correction of imaging aberrations of the illumination optical unit 4.

The number of individual mirrors 18 is at least equal to the number of field facets 22. In the case of the embodiment according to FIG. 1, the number of individual mirrors 18 is actually much greater than the number of field facets 22 and can be, in particular, ten times as great or even greater still. The configuration of the illumination optical unit 4 is such that the individual-mirror array 17 is not imaged onto the field facets 22 nor onto the pupil facets 23.

The field facets 22 and the pupil facets 23 are arranged in such a way that the illumination channels 24, each formed by exactly one of the field facets 22 and exactly one of the pupil facets 23, which facets in each case are aligned for guiding a partial beam of the illumination light 14, are in each case fixedly assigned to a facet pair 22, 23 to which the field facet 22 and the pupil facet 23 belong. An illumination beam path 26 is therefore fixedly predefined in the illumination optical unit 4 proceeding from the field facet mirror 20. A variation of the illumination is brought about exclusively via a tilting of the individual mirrors 18 of the individual-mirror array 17, wherein the individual-mirror array 17 is used to select which of the field facets 22 are impinged upon with the illumination light 14 in sections, if appropriate.

Within the fixed illumination channel assignment, adjacent field facets 22 of a field facet pair $22_{i,j}$ are assigned to a pupil facet pair $23_{i,j}$ whose pupil facets $23_{i,j}$ are arranged point-symmetrically with respect to a center $Z_{21}$ of the pupil facet mirror 21. However, such a neighborhood assignment is not mandatory. A pupil facet pair $23_{i,j}$ can also be assigned field facets 22 of a field facet pair $22_{i,j}$ which result in a guidance of the illumination channels 24 which run in a manner projected onto the pupil face mirror 21 adjacent to a center $Z_{21}$ of the pupil facet mirror 21, as will be described below. For this purpose, the field facets 22 of a field facet pair $22_{i,j}$ can also be arranged point-symmetrically with respect to a center $Z_{20}$ of the field facet mirror 20.

Since a multiplicity of the individual mirrors 18 of the individual-mirror array 17 can be assigned to each of the field facets 22 via a corresponding individual-mirror tilting and, in particular, a plurality of individual-mirror rows of the individual-mirror array 17 that run in the x-direction can be assigned to each of the field facets 22, the field facets 22 can be illuminated in sections via the individual mirrors 18. As indicated by way of example in FIG. 1 on the basis of the example of one of the field facets 22, via corresponding row-by-row selection of the individual mirrors 18 on the individual-mirror array 17, strip sections 22a, 22b, 22c, 22d which extend over the entire field facet 22 in the x-direction can be illuminated independently of one another on the respective field facet 22 and also independently of one another on the field facet mirror 20. This results in facet section images 5a, 5b, 5c, 5d on the object field 5, as illustrated schematically in FIG. 3.

Figure 3:
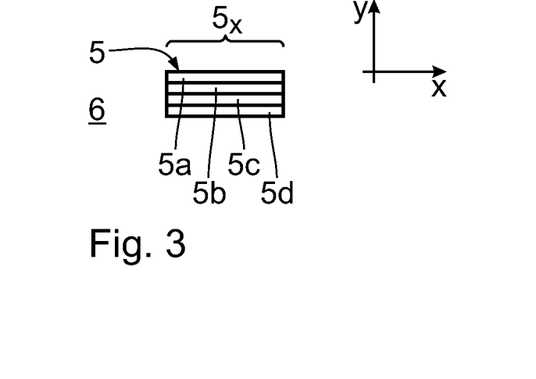
FIG. 3 shows a plan view of an object field illuminated in a stripwise manner with an illumination optical unit of the projection exposure apparatus according to FIG. 1.

The facet section images 5a to 5d represent strips in the object field 5 which extend along the x-direction, that is to say transversely with respect to the object displacement direction y, over an entire object field height $5_x$ of the object field 5. The facet section images 5a to 5d can overlap in the object field 5. However, this is not mandatory. The facet section images 5a to 5d directly adjoin one another in the object field 5.

The illuminated facet sections 22a to 22d have an area extent which, in the embodiment illustrated, corresponds to one quarter of an entire reflection surface of the respective field facet 22. The illuminated field facet sections 22a to 22d can also have a different area extent, corresponding for example to one half, one third, one quarter, one fifth or else some other fraction of the entire reflection surface of the respective field facet 22.

Figure 4:
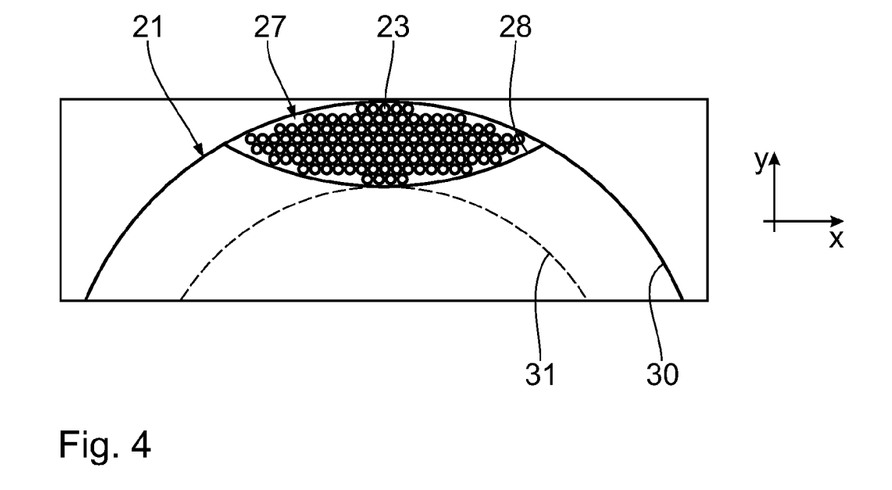
FIG. 4 shows a plan view of an excerpt from a pupil facet mirror of the illumination optical unit of the projection exposure apparatus according to FIG. 1, wherein illuminated pupil facets within a pole of a dipole setting are individually illustrated.

FIG. 4 shows an arrangement which is more realistic in a manner to scale with regard to the distribution of the pupil facets 23 on a pupil facet carrier 27 of the pupil facet mirror 21. Exclusively the pupil facets 23 within a pole section 28 of the pupil facet mirror 21 are shown. The pole section 28 constitutes one of the poles of a y-dipole of a selected illumination setting of the illumination optical unit 4. The illumination setting involves an illumination angle distribution of an illumination of the object field 5. A total of 120 pupil facets 23 are arranged in the pole section 28. A corresponding pole section is present mirror-symmetrically on the opposite side of the pupil facet carrier 27. In the case of the illumination setting "y-dipole", therefore, a total of 240 pupil facets 23 are illuminated via the corresponding illumination channels 24, wherein the associated field facets 22 are impinged upon with the illumination light 14 via correspondingly tilted individual mirrors 18 of the individual-mirror array 17. In this case, each of the field facets 22 is impinged upon by a closed group 29 of the individual mirrors 18, the group form of which corresponds to the form and to the xy aspect ratio of the assigned field facet 22. Such an individual-mirror group 29 is highlighted in a hatched manner as the topmost row of individual mirrors 18 in FIG. 1. The respective field facets are then illuminated completely, that is to say not in sections, via the individual mirrors 18. The individual mirrors 18 within one of the individual-mirror groups all have the same deflection angle for the illumination light 14.

In an alternative illumination setting, which can likewise be produced with the illumination optical unit 4, exclusively those pupil facets 23 are illuminated which lie on the pupil facet carrier 27 between an outer carrier boundary 30 and an inner carrier boundary that is spaced apart therefrom and is concentric with respect to the center $Z_{21}$ of the pupil facet mirror 21. The number of pupil facets 23 between these two carrier boundaries 30, 31 is very much greater than the number of pupil facets 23 in the pole section 28, for example, and can be 2000 pupil facets 23, for example. By virtue of corresponding selection of the tilting of the individual mirrors 18 of the individual-mirror array 17, the illumination of the associated illumination channels 24 is in this case not predetermined via completely illuminated field facets 22, but rather predetermined only via field facets 22 illuminated in a stripwise manner in the region of field facet sections 22a or 22b or 22c or 22d. In comparison with the dipole setting described above, in the case of the annular illumination setting, only one quarter of the illumination light 14 then passes in each of the illumination channels 24. A very homogeneous illumination of the pupil facet mirror 21 between the carrier boundaries 30, 31 is achieved. An object field point on the reticle 7 then "sees", during scanning through the object field sections 5a to 5d, in each case illumination angle distributions corresponding to a subensemble of pupil facets 23 which corresponds to one quarter of all the pupil facets 23 which are arranged between the carrier boundaries 30, 31. These four pupil facet subensembles complement one another to form an illumination from the direction of all pupil facets 23 between the carrier boundaries 30 and 31. In a manner integrated in the scanning direction, the reticle point considered is therefore impinged upon with the illumination light 14 from the direction of all of the pupil facets 23 between the carrier boundaries 30 and 31.

In the case of the illumination settings discussed above, the individual mirrors 18 can be used by swinging away for the correction of an intensity distribution and/or for the correction of an illumination angle distribution over the object field 5 or the image field 10. In this case, the correction individual mirrors 18 are swung away such that they guide part of the illumination beam path 26 in a targeted manner, such that the part is no longer available for the exposure of the object field 5.

Figure 5:
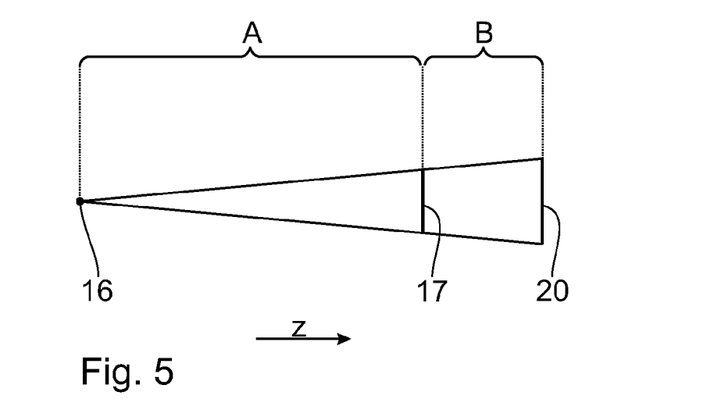
FIG. 5 shows schematically distance relationships between an intermediate focus, the individual-mirror array and a field facet mirror of the illumination optical unit of the projection exposure apparatus according to FIG. 1.

FIG. 5 schematically illustrates distance relationships of an arrangement of the intermediate focus 16 of the individual-mirror array 17 and of the field facet mirror 20 in the illumination beam path. A light distance A between the intermediate focus 16 and the individual-mirror array 17 is greater than a light distance B between the individual-mirror array 17 and the field facet mirror 20.

An explanation is given below, with reference to FIGS. 6 and 7, of a further embodiment of an illumination optical unit 32, which can be used instead of the illumination optical unit 4 of the projection exposure apparatus 1. Components and functions corresponding to those which have already been explained above with reference to FIGS. 1 to 5 bear the same reference numerals, if appropriate, and will not be discussed in detail again. From viewing direction VII in FIG. 6, the field facet mirror 20 is seen from the rear per se. FIG. 7 nevertheless shows the field facet mirror 20 with reflection surfaces of the field facets 22 facing the observer.

In the case of the illumination optical unit 32, the individual-mirror array 17 is arranged on a conical carrying surface of an individual-mirror carrier 33. The individual mirrors 18 themselves are not illustrated in FIG. 6. The cone shape of the carrying surface is such that a cone angle k between a cone axis K and the carrying surface is less than 90° and, in particular, is in the range of between 60° and 88°. A center of the carrying surface of the individual-mirror carrier 33 in the region of an intersection point of the cone axis K is elevated the furthest relative to the rest of the carrying surface. By virtue of this conical arrangement of the individual-mirror array 17, it is possible to achieve minimal switching angles of the individual mirrors 18 when switching over between different field facets 22.

The polarizing effect of the reflection of the illumination light 14 at the facets 22 and 23 of the respective illumination channel 24*a*, 24*b* is explained below with the aid of the illumination beam path 26 illustrated for two illumination channels 24*a*, 24*b* in FIG. 6. Prior to reflection at the field facet mirror 20, the illumination light 14 is still unpolarized or has a partial polarization that is undefined in relation to the reticle illumination.

The reflection of the illumination light 14 at the field facets 22 is effected with angles α of incidence in the range of the Brewster angle of the multilayer reflection coatings on the field facets 22. This reflection angle α is in the range of between 20° and 65°.

The illumination light 14 is likewise acted on at the pupil facets 23 of the pupil facet mirror 21 with angles β of incidence that are in the range of the Brewster angle of the multi-layer reflection coatings on the pupil facets 23, for example once again in the range of between 20° and 65°. If the illumination channels 24 are aligned such that they are guided upon the reflections at the associated facets 22, 23 in a plane which either contains the central axis Z or is adjacent thereto, linearly polarized light results. This is shown in FIG. 6 with the aid of the two illumination channels 24*a* and 24*b* running in the plane of the drawing in FIG. 6, wherein, for these illumination channels 24*a*, 24*b*, linearly polarized illumination light having a direction of polarization perpendicular to the plane of the drawing results, which is illustrated in FIG. 6 by points illustrated on the illumination light rays between the pupil facet mirror 21 and the object field 5.

The schematic plan view in FIG. 7 shows the polarization effect for two illumination channels 24*c* and 24*d* having reflection planes that are closely adjacent to the central axis Z. The result in each case is a linear polarization of the illumination light 14, which polarization runs perpendicularly to the respective reflection planes of the illumination channels 24*c* and 24*d*. Corresponding polarizations P can be achieved via the field facet groups 34 arranged around the center Z, in so far as the illumination channels 24 proceeding from the associated field facets 22 in turn predetermine reflection planes in the vicinity of the central axis Z. The linear polarizations that can be achieved via the respective field facet groups 34 are indicated in FIG. 7 by polarization double-head arrows P adjacent to the field facet groups 34. This results in the possibility of illuminating the object field 5 with linear polarization that is tangential with respect to the central axis Z overall.

In a targeted manner, by correspondingly predetermining the illumination channels 24, it is also possible to bring about an elliptical illumination polarization or else an unpolarized illumination, by virtue of the respective illumination channel 24 predetermining a reflection plane of the illumination beam path between the field facet 22 and the object field 5 which runs in a manner spaced apart further from the central axis Z. This is indicated by way of example on the basis of the illumination channel 24*e* in FIG. 7.

Figure 6:
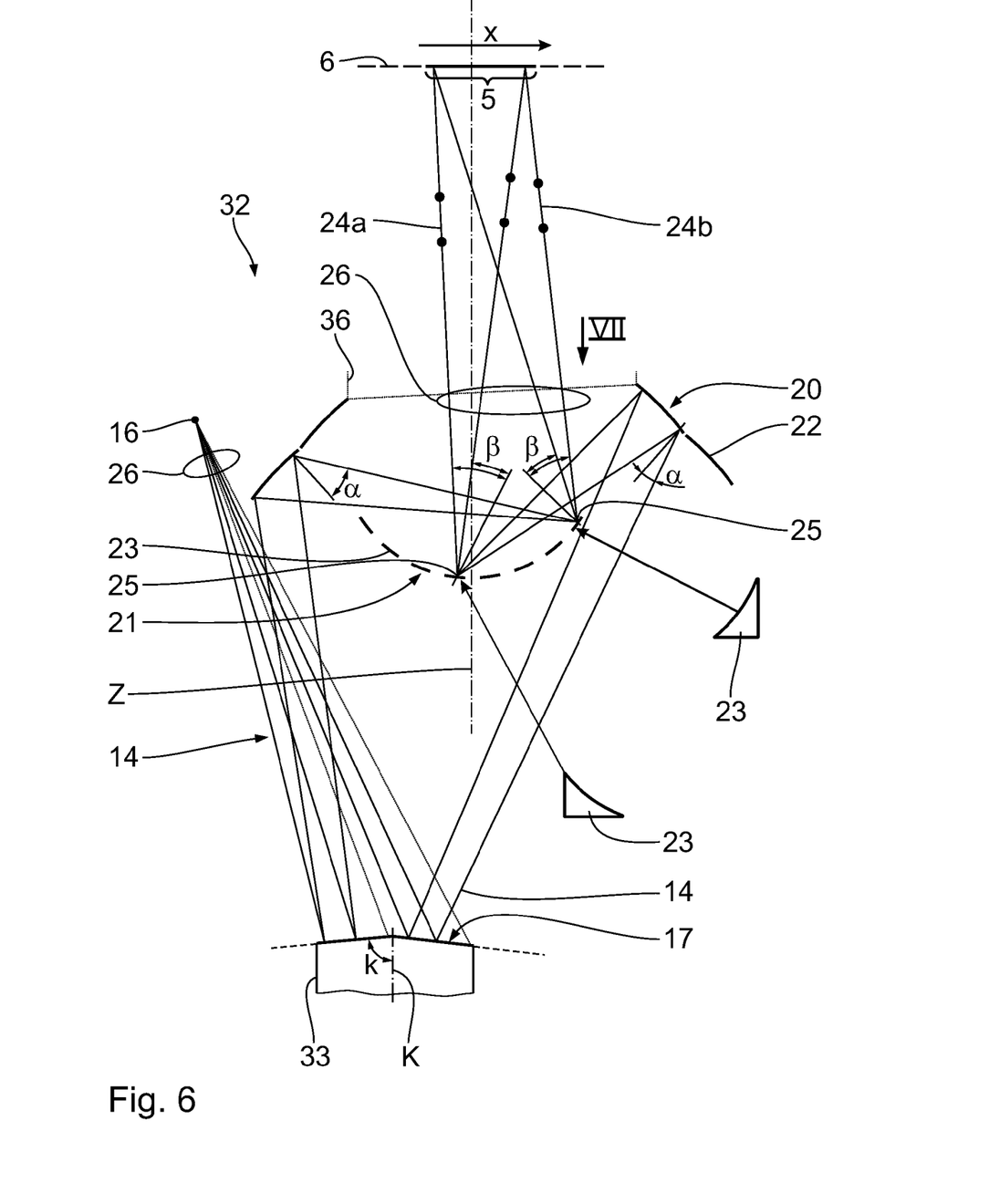
FIG. 6 shows schematically, in a meridional section, an excerpt from a further embodiment of the illumination optical unit for use in the projection exposure apparatus in the region of beam guiding of illumination light between the intermediate focus and the object field or illumination field.
Figure 7:
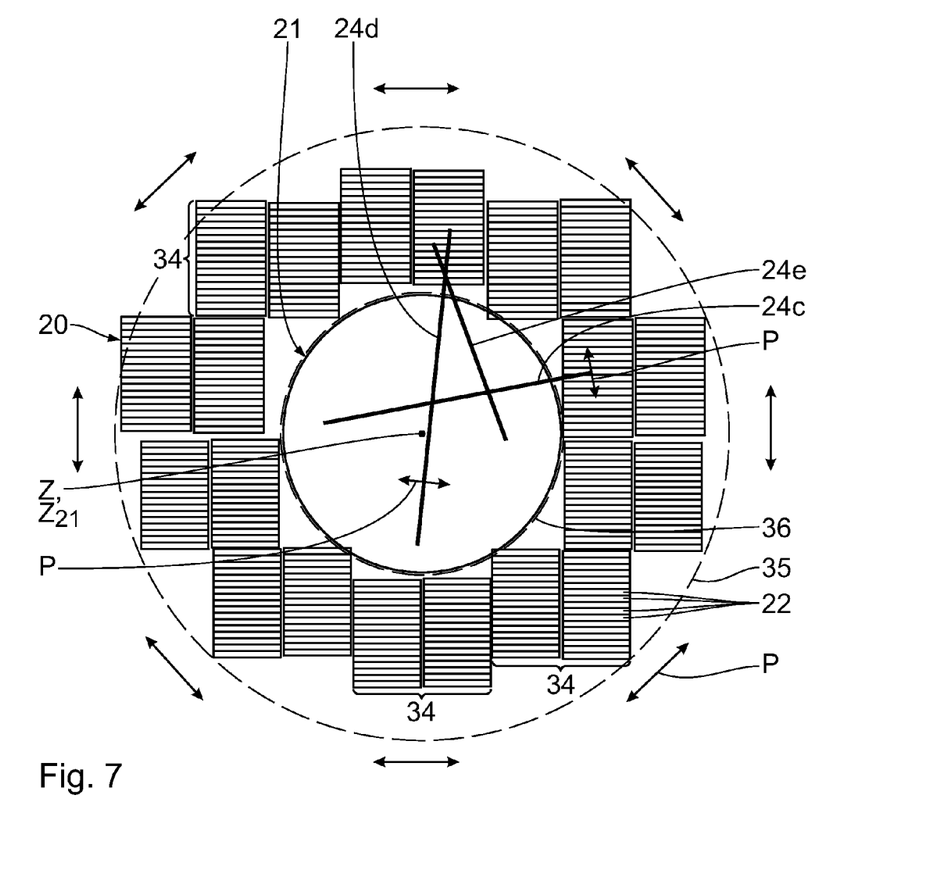
FIG. 7 shows a view of the arrangement of a field facet mirror and of a pupil facet mirror of the illumination optical unit from viewing direction VII in FIG. 6.

In the case of the illumination optical unit 32 according to FIGS. 6 and 7, the field facets 22 are arranged on a field facet mirror carrier 35, which has a central passage opening 36 for the illumination light 14 which is guided in a section of the illumination beam path 26 between the pupil facet mirror 21 and the object field 5.

The pupil facets 23 have an imaging effect in the case of the illumination optical unit 32. Reflection surfaces of the pupil facets 23 are designed in concave fashion in the case of the illumination optical unit 32, as is shown in FIG. 6 on the basis of two pupil facets 23 picked out in an enlarged view by way of example.

Figure 8:
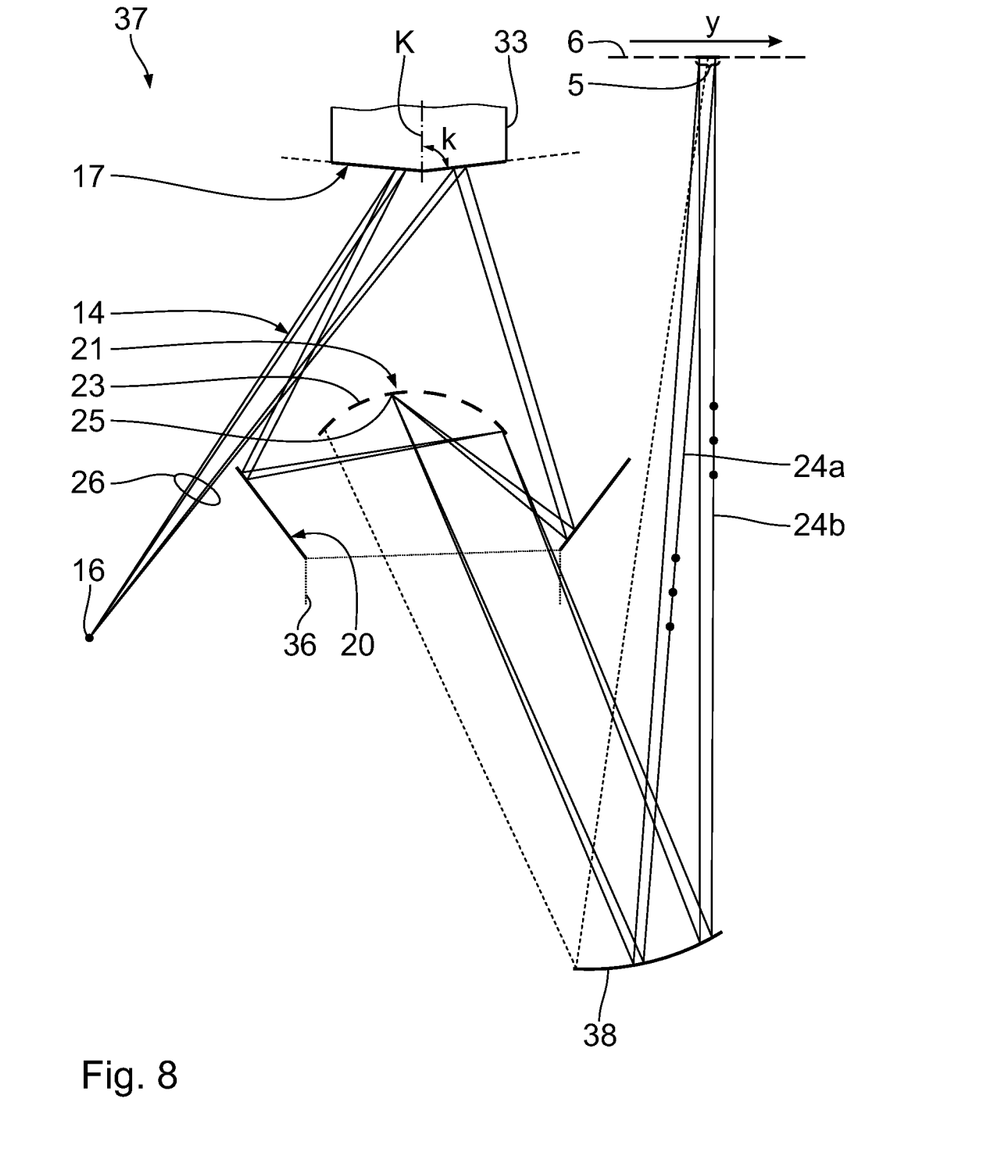
FIG. 8 shows, in an illustration similar to FIG. 6, a further embodiment of the illumination optical unit.

An explanation is given below, with reference to FIG. 8, of a further embodiment of an illumination optical unit 37, which can be used instead of the illumination optical units 4 and 32, respectively, in the projection exposure apparatus 1. Components and functions which have already been described above with reference to FIGS. 1 to 7, and in particular with reference to FIG. 6, bear the same reference numerals, if appropriate, and will not be discussed in detail again.

In the case of the illumination optical unit 37, the pupil facets 23 of the pupil facet mirror 21 are embodied in plane fashion. A relay optical unit in the form of a concave mirror 38 serves as a transfer optical unit for imaging the field facets of the field facet mirror 20 into the object field 5.

In the case of the illumination optical unit 37, the reflection surfaces of the pupil facets 23 can optionally be configured as correction aspheres in order to correct imaging aberrations of the imaging by the concave mirror 38.

Figure 9:
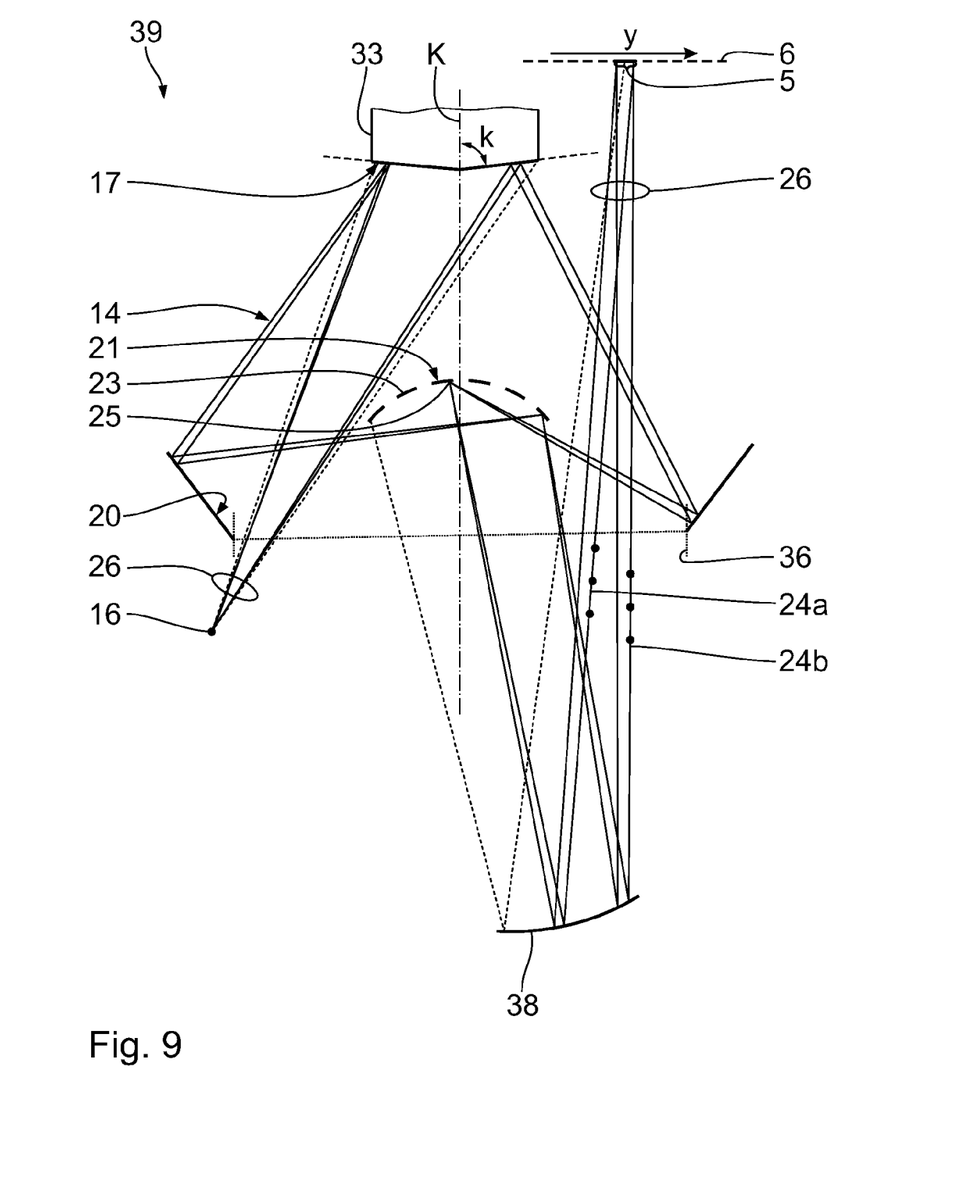
FIG. 9 shows, in an illustration similar to FIG. 6, a further embodiment of the illumination optical unit.

An explanation is given below, with reference to FIG. 9, of a further embodiment of an illumination optical unit 39, which can be used instead of the illumination optical units 4 and 32, respectively, in the projection exposure apparatus 1. Components and functions which have already been described above with reference to FIGS. 1 to 8, and in particular with reference to FIGS. 6 and 8, bear the same reference numerals, if appropriate, and will not be discussed in detail again.

In the case of the illumination beam path 26 of the illumination optical unit 39, the illumination light 14 is guided through the passage opening 36 between the concave mirror 38 and the object field 5, through which passage opening the illumination light 14 is also guided in the illumination beam path 26 between the pupil facet mirror 21 and the concave mirror 38.

In addition, in the case of the illumination optical unit 39, the illumination light 14 is guided through the passage opening 36 between the intermediate focus 16 and the individual-mirror array 17.

During projection exposure, the reticle 7 and the wafer 12 bearing a coating that is light-sensitive to the EUV radiation beam 14 are provided. Prior to exposure, an illumination setting is set, that is to say for example a dipole setting or an annular setting, as described above, or else a different setting, for example a conventional illumination setting or a multipole illumination setting. Afterward, at least one section of the reticle 7 is projected onto the wafer 12 with the aid of the projection exposure apparatus 1. Finally, the light-sensitive layer exposed by the EUV radiation beam 14 on the wafer 12 is developed. The micro- or nanostructured component, for example a semiconductor component, for example a memory chip, is produced in this way.

The invention claimed is:

1. An illumination optical unit configured to illuminate an object field with illumination light, the illumination optical unit comprising:
    a collector configured to collect illumination light emitted by a light source and to transfer the illumination light into an intermediate focus;
    a field facet mirror disposed in a plane conjugate to the object plane;
    the field facet mirror comprising a plurality of field facets;
    a pupil facet mirror comprising a plurality of pupil facets; and
    a mirror array comprising individual mirrors which are individually tiltable,
    wherein:
        during use of the illumination optical unit, the field facets are imaged into the object field via a transfer optical unit;
        the mirror array is upstream of the field facet mirror along a beam path the illumination light takes through the illumination optical unit during use of the illumination optical unit;
        the mirror array is downstream of the intermediate focus along the beam path;
        the mirror array is configured so that, during use of the illumination optical unit, the intermediate focus is imaged via illumination channels into a spatial region in which the pupil facet mirror is disposed;
        each illumination channel is formed by at least one of the individual mirrors and at least one of the field facets;
        each illumination channel guides a partial beam of the illumination light;
        angles of incidence of the beam path along illumination channels, each formed by a field facet and a pupil facet and aligned to guide a partial beam of the illumination light, deviate by a maximum of 25° from a Brewster angle of a multilayer reflection coating on the field facet and a multilayer reflection coating on the pupil facet; and
        the illumination optical unit is a projection lithography illumination optical unit.

2. The illumination optical unit of claim 1, wherein a light path in the beam path between the intermediate focus and the mirror array is longer than a light path in the beam path between the mirror array and the field facet mirror.

3. The illumination optical unit of claim 2, wherein the field facets and the pupil facets are configured so that illumination channels, each formed by exactly one of the field facets and exactly one of the pupil facets aligned to guide a partial beam of the illumination light, are in each case fixedly assigned to a facet pair to which the field facet and the pupil facet belong.

4. The illumination optical unit of claim 3, wherein field facets of a field facet pair are assigned to a pupil facet pair whose pupil facets are arranged point-symmetrically with respect to a center of the pupil facet mirror.

5. The illumination optical unit of claim 4, wherein the illumination optical unit is configured so that, during use of the illumination optical unit, at least some of the field facets are illuminated with the illumination light in field facet sections via the individual mirrors.

6. The illumination optical unit of claim 5, wherein the field facet mirror is supported by a field facet mirror carrier having an opening that intersects the beam path between the pupil facet mirror and the object field.

7. The illumination optical unit of claim 6, wherein the beam path intersects the opening between the intermediate focus and the mirror array.

8. The illumination optical unit of claim 7, wherein, during use of the illumination optical unit, the illumination light is guided through the opening between a component of the transfer optical unit and the object field, wherein the component is downstream of the pupil facet mirror along the beam path.

9. The illumination optical unit of claim 6, wherein, during use of the illumination optical unit, the illumination light is guided through the opening between a component of the transfer optical unit and the object field, wherein the component is downstream of the pupil facet mirror along the beam path.

10. The illumination optical unit of claim 1, wherein the field facets and the pupil facets are configured so that illumination channels, each formed by exactly one of the field facets and exactly one of the pupil facets aligned to guide a partial beam of the illumination light, are in each case fixedly assigned to a facet pair to which the field facet and the pupil facet belong.

11. The illumination optical unit of claim 1, wherein field facets of a field facet pair are assigned to a pupil facet pair whose pupil facets are arranged point-symmetrically with respect to a center of the pupil facet mirror.

12. The illumination optical unit of claim 1, wherein the illumination optical unit is configured so that, during use of the illumination optical unit, at least some of the field facets are illuminated with the illumination light in field facet sections via the individual mirrors.

13. The illumination optical unit of claim 1, wherein the field facet mirror is supported by a field facet mirror carrier having an opening that intersects the beam path between the pupil facet mirror and the object field.

14. The illumination optical unit of claim 13, wherein the beam path intersects the opening between the intermediate focus and the mirror array.

15. A system, comprising:
    an illumination optical unit according to claim 1;
    a projection optical unit configured to image the object field into an image field,
    wherein the system is an illumination system.

16. An apparatus, comprising:
an EUV light source; and
an illumination system, comprising:
- an illumination optical unit according to claim 1;
- a projection optical unit configured to image the object field into an image field, wherein the apparatus is a projection exposure apparatus.

17. The apparatus of claim 16, further comprising:
- a first holder configured to hold a first object in the object plane;
- a first displacement drive configured to displace the first holder along an object displacement direction;
- a second holder configured to hold a second object in the image field; and
- a second displacement drive configured to displace the second holder along the displacement direction.

18. The apparatus of claim 17, wherein the illumination optical unit is configured so that facet section images of illuminated field facet sections represent strips in the object field which extend transversely with respect to the object displacement direction over an entire object field height of the object field.

19. A method of using a projection exposure apparatus comprising an illumination optical unit and a projection optical unit, the method comprising:
- using the illumination optical unit to illuminate structures of a reticle in an object plane of the projection optical unit; and
- using the projection optical unit to project at least some of the illuminated structures of the reticle onto a light-sensitive material in an image plane of the projection optical unit, wherein the illumination optical unit is an illumination optical unit according to claim 1.

20. An illumination optical unit configured to illuminate an object field with illumination light, the illumination optical unit comprising:
- a collector configured to collect illumination light emitted by a light source and to transfer the illumination light into an intermediate focus;
- a field facet mirror disposed in a plane conjugate to the object plane;
- the field facet mirror comprising a plurality of field facets;
- a mirror array comprising individual mirrors which are individually tiltable, the mirror array being between the intermediate focus and the field facet mirror along a beam path the illumination light takes through the illumination optical unit during use of the illumination optical unit; and
- a pupil facet mirror comprising a plurality of pupil facets, wherein:
- during use of the illumination optical unit, the field facets are imaged into the object field via the pupil facet mirror;
- the mirror array is configured so that, during use of the illumination optical unit, the intermediate focus is imaged via illumination channels into a spatial region in which the pupil facet mirror is disposed;
- each illumination channel is formed by at least one of the individual mirrors and at least one of the field facets;
- each illumination channel guides a partial beam of the illumination light;
- angles of incidence of the beam path along illumination channels, each formed by a field facet and a pupil facet and aligned to guide a partial beam of the illumination light, deviate by a maximum of 25° from a Brewster angle of a multilayer reflection coating on the field facet and a multilayer coating on the pupil facet; and
- the illumination optical unit is a projection lithography illumination optical unit.

* * * * *

UNITED STATES PATENT AND TRADEMARK OFFICE
CERTIFICATE OF CORRECTION

PATENT NO. : 9,964,856 B2  
APPLICATION NO. : 14/528275  
DATED : May 8, 2018  
INVENTOR(S) : Maul Page 1 of 1

It is certified that error appears in the above-identified patent and that said Letters Patent is hereby corrected as shown below:

Column 1, Lines 30-31: Delete "2011/0 001 947" and insert -- 2011/0001947 --, therefor.

Column 1, Lines 35-36: Delete "2009/100 856" and insert -- 2009/100856 --, therefor.

Column 3, Line 59: Delete "derivable" and insert -- drivable --, therefor.

Column 7, Line 24: Delete "100 000" and insert -- 100,000 --, therefor.

Column 7, Line 28: Delete "500 000" and insert -- 500,000 --, therefor.

Column 9, Line 23: Delete "$22_{i,\,j}$" and insert -- $22_{i,j}$ --, therefor.

Column 9, Line 24: Delete the first and second occurrence of "$23_{i,\,j}$" and insert -- $23_{i,j}$ --, therefor.

Column 9, Line 27: Delete "$23_{i,\,j}$" and insert -- $23_{i,j}$ --, therefor.

Column 9, Line 28: Delete "$22_{i,\,j}$" and insert -- $22_{i,j}$ --, therefor.

Column 9, Line 33: Delete "$22_{i,\,j}$" and insert -- $22_{i,j}$ --, therefor.

Column 10, Line 21: Delete "xy" and insert -- x/y --, therefor.

Signed and Sealed this  
Twenty-fifth Day of September, 2018

Andrei Iancu  
*Director of the United States Patent and Trademark Office*